United States Patent
Ma

(10) Patent No.: US 12,351,917 B2
(45) Date of Patent: Jul. 8, 2025

(54) MULTI-ZONE HEATER TUNING IN SUBSTRATE HEATER

(71) Applicant: Applied Materials, Inc., Santa Clara, CA (US)

(72) Inventor: Jun Ma, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1254 days.

(21) Appl. No.: 17/247,128

(22) Filed: Dec. 1, 2020

(65) Prior Publication Data

US 2022/0170159 A1    Jun. 2, 2022

(51) Int. Cl.
| | |
|---|---|
| C23C 14/22 | (2006.01) |
| C23C 14/54 | (2006.01) |
| C23C 16/46 | (2006.01) |
| C23C 16/52 | (2006.01) |
| G06N 3/08 | (2023.01) |
| H01J 37/32 | (2006.01) |

(52) U.S. Cl.
CPC .......... *C23C 16/52* (2013.01); *C23C 14/22* (2013.01); *C23C 14/541* (2013.01); *C23C 16/46* (2013.01); *G06N 3/08* (2013.01); *H01J 37/32724* (2013.01); *H01J 2237/2001* (2013.01)

(58) Field of Classification Search
CPC ....... C23C 16/52; C23C 14/22; C23C 14/541; C23C 16/46; G06N 3/08; H01J 37/32724; H01J 2237/2001
See application file for complete search history.

(56) References Cited

U.S. PATENT DOCUMENTS

| | | | |
|---|---|---|---|
| 7,304,744 B1 * | 12/2007 | Hatanaka | G01J 3/0232 356/504 |
| 2005/0167514 A1 | 8/2005 | Kaushal et al. | |
| (Continued) | | | |

FOREIGN PATENT DOCUMENTS

WO    2006-107523    10/2006

OTHER PUBLICATIONS

International Search Report and Written Opinion for International Application No. PCT/US2021/061009, mailed on Mar. 29, 2022, 10 pages.

*Primary Examiner* — Mohamed Charioui
*Assistant Examiner* — Dacthang P Ngo
(74) *Attorney, Agent, or Firm* — Lowenstein Sandler LLP

(57) ABSTRACT

A system includes multi-zone heater with heating elements within a substrate support that correspond to multiple zones of the substrate support. A processing device coupled to the heating elements and to access a temperature matrix with multiple vectors corresponding to zones; determine a temperature map of the substrate support by multiplying the temperature matrix by a weight vector, the weight vector containing estimated weight values for each respective vector; determine a target thickness map of a film on a substrate based on an original thickness map and the temperature map, the original thickness map having data characterizing an original thickness across locations of an original film at a uniform temperature; iteratively update the estimated weight values so that the temperature map results in minimization to a standard deviation of thickness values within the target thickness map; and employ the estimated weight values as control values for the heating elements.

22 Claims, 11 Drawing Sheets

(56) References Cited

U.S. PATENT DOCUMENTS

| | | | | |
|---|---|---|---|---|
| 2012/0292305 | A1* | 11/2012 | Ambal | G05D 23/22 |
| | | | | 219/520 |
| 2013/0171746 | A1 | 7/2013 | Chang et al. | |
| 2016/0345384 | A1* | 11/2016 | Zhang | H01L 21/67248 |
| 2017/0263484 | A1 | 9/2017 | Lin et al. | |
| 2017/0309529 | A1* | 10/2017 | Aderhold | H01L 21/324 |
| 2019/0095797 | A1* | 3/2019 | Dhandapani | B24B 37/20 |
| 2019/0153600 | A1 | 5/2019 | Roberts et al. | |
| 2020/0037399 | A1 | 1/2020 | Zhang et al. | |
| 2020/0105549 | A1* | 4/2020 | Lee | H01L 22/30 |
| 2020/0389939 | A1* | 12/2020 | Yender | H05B 1/023 |
| 2022/0075399 | A1* | 3/2022 | Oplawski | H05B 1/0288 |

\* cited by examiner

```
                                                            600B
                                                          ↙

┌─────────────────────────────────────────────────────────────────────────────┐
│ Correlate each heating element, of multiple heating elements in a multi-zone │
│ heater of a substrate support, with a zone of multiple zones of the substrate│
│ support configured to heat a substrate during processing.                    │
│                                    650                                       │
└─────────────────────────────────────────────────────────────────────────────┘
                                      ↓
┌─────────────────────────────────────────────────────────────────────────────┐
│ Access a temperature matrix of multiple vectors corresponding to the multiple│
│ zones, where values in each vector represent a temperature rise across       │
│ locations on the substrate support as a result of a corresponding heating    │
│ element, of the multiple heating elements, being activated at a temperature  │
│ set point.                                                                   │
│                                    655                                       │
└─────────────────────────────────────────────────────────────────────────────┘
                                      ↓
┌─────────────────────────────────────────────────────────────────────────────┐
│ Determine a temperature map of the substrate support by multiplying the      │
│ temperature matrix by a weight vector, where the weight vector contains      │
│ estimated weight values for each respective vector of the temperature matrix.│
│                                    660                                       │
└─────────────────────────────────────────────────────────────────────────────┘
                                      ↓
┌─────────────────────────────────────────────────────────────────────────────┐
│ Determine a target parameter map of a film on a substrate to be processed on │
│ the substrate support based on an original parameter map and the temperature │
│ map, the original parameter map of data characterizing a process parameter   │
│ across locations of an original film on an original substrate heated at a    │
│ uniform temperature.                                                         │
│                                    665                                       │
└─────────────────────────────────────────────────────────────────────────────┘
                                      ↓
┌─────────────────────────────────────────────────────────────────────────────┐
│ Iteratively update the estimated weight values of the weight vector so that  │
│ the temperature map results in minimizing a standard deviation of parameter  │
│ values within the target parameter map.                                      │
│                                    670                                       │
└─────────────────────────────────────────────────────────────────────────────┘
                                      ↓
┌─────────────────────────────────────────────────────────────────────────────┐
│ Employ the estimated weight values as control values for respective ones of  │
│ the multiple heating elements while processing subsequent substrates.        │
│                                    675                                       │
└─────────────────────────────────────────────────────────────────────────────┘
```

FIG. 6B

MULTI-ZONE HEATER TUNING IN SUBSTRATE HEATER

TECHNICAL FIELD

Embodiments of the present disclosure relate to multi-zone heater tuning in a substrate heater.

BACKGROUND

Substrate heaters generally include a single heating element located within a substrate support and are simply controlled by a single temperature set point. Films or processing layers being processed on a substrate lying on the substrate support, however, can become uneven with uneven temperature distribution across the substrate support. Even fairly minor temperature variations can cause a several percentage variation in thickness of a processing film and/or of other film-related properties, which can cause inconsistent semiconductor manufacturing on the surface of substrates. With sufficient variations, manufactured devices with strict tolerance requirements may have to scrapped.

SUMMARY

Some of the embodiments described herein cover a system that includes a system including a multi-zone heater including multiple heating elements within a substrate support configured to heat a substrate undergoing processing. The multiple heating elements correspond to multiple zones of the substrate support. The system can further include a processing device coupled to the multiple heating elements. The processing device is to access a temperature matrix including multiple vectors corresponding to the multiple zones, wherein values in each vector represent a temperature rise across locations on the substrate support as a result of a corresponding heating element, of the multiple heating elements, being activated at a temperature set point. The processing device is further to determine a temperature map of the substrate support by multiplying the temperature matrix by a weight vector. The weight vector may contain estimated weight values for each respective vector of the temperature matrix. The processing device is further to determine a target thickness map of a film on a substrate to be processed on the substrate support based on an original thickness map and the temperature map, the original thickness map including data characterizing an original thickness across locations of an original film on an original substrate heated at a uniform temperature. The processing device is further to iteratively update the estimated weight values of the weight vector so that the temperature map results in minimization to a standard deviation of thickness values within the target thickness map. The processing device is further to employ the estimated weight values as control values for respective ones of the multiple heating elements while processing subsequent substrates.

In related embodiments, described herein is a method for tuning a multi-zone heater. The method can include correlating each heating element, of multiple heating elements in a multi-zone heater of a substrate support, with a zone of multiple zones of the substrate support configured to heat a substrate during processing. The method can further include accessing, by a processing device, a temperature matrix including multiple vectors corresponding to the multiple zones, wherein values in each vector represent a temperature rise across locations on the substrate support as a result of a corresponding heating element, of the multiple heating elements, being activated at a temperature set point. The method can further include determining, by the processing device, a temperature map of the substrate support by multiplying the temperature matrix by a weight vector, wherein the weight vector contains estimated weight values for each respective vector of the temperature matrix. The method can further include determining, by the processing device, a target parameter map of a film on a substrate to be processed on the substrate support based on an original parameter map and the temperature map, the original parameter map including data characterizing a process parameter across locations of an original film on an original substrate heated at a uniform temperature. The method can further include iteratively updating, by the processing device, the estimated weight values of the weight vector so that the temperature map results in minimizing a standard deviation of parameter values within the target parameter map. The method can further include employing, by the processing device, the estimated weight values as control values for respective ones of the multiple heating elements while processing subsequent substrates.

In a further embodiment, described herein is a method for training a machine learning model to generate a temperature matrix useable for tuning the multi-zone heater. The method can include receiving, by a computing device, a training dataset including a plurality of data items, each data item of the plurality of data items including a set of temperature values across locations of a substrate support containing a multi-zone heater and a set of thickness values of a film on a substrate that was processed while on the substrate support. The method can further include inputting, by the computing device, the training dataset into a machine learning model. The method can further include training, by the computing device, the machine learning model based on the training dataset to generate a trained machine learning model that updates values of a temperature matrix including multiple vectors corresponding to multiple zones of the multi-zone heater. The values in each vector represent a temperature rise across locations on the substrate support as a result of a corresponding heating element, of multiple heating elements of the multi-zone heater, being set to one or more temperature set points, and where a combination of the multiple vectors includes a target set of temperature values across the substrate support useable to ensure a threshold level of film uniformity.

In a further embodiment, described herein is a method for training a machine learning model for tuning the multi-zone heater. The method can include correlating each heating element, of multiple heating elements in a multi-zone heater of a substrate support, with a zone of multiple zones of the substrate support configured to heat substrates during processing. The method can further include receiving a training dataset including a plurality of data items, each data item of the plurality of data items including a plurality of temperature set points and a thickness map associated with a substrate. The plurality of temperature set points may control the multiple heating elements and the thickness map includes data characterizing a film thickness across locations of a film on the substrate. The method can further include inputting, by a processing device, the training dataset into a machine learning model. The method can further include training, by the processing device, the machine learning model based on the training dataset to generate a trained machine learning model that is to receive, as an input, a target thickness and is to output a set of temperature set points for the multiple heating elements that results in the film having the target thickness.

In a further embodiment, described herein is a method for using the machine learning model for inferencing input data in order to the tune the multi-zone heater. The method can include receiving a substrate onto a substrate support of a processing chamber, the substrate support configured to heat the substrate during processing using multiple heating elements corresponding to multiple zones of a multi-zone heater within the substrate support. The method can further include receiving, by a processing device of the processing chamber, information indicative of a process to be performed on the substrate and of a target thickness for a film on the substrate. The method can further include inputting at least one of the process to be performed or the target thickness into a trained machine learning model. The trained machine learning model can output a set of temperature set points for the multiple heating elements that is associated with the process, where the set of temperature set points results in the film on the substrate having the target thickness with a standard deviation of thickness values across locations of the substrate being less than a threshold value. The method can further include setting, by the processing device, the multiple heating elements to operate at the set of temperature set points. The method can further include processing the substrate in the processing chamber using the multiple heating elements at the set of temperature set points.

Numerous other features are provided in accordance with these and other embodiments of the disclosure. Other features and embodiments of the present disclosure will become more fully apparent from the following detailed description, the claims, and the accompanying drawings.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 6B is a flow diagram of a method for finding a weight vector that minimizes a standard deviation of a processing parameters of a film across the substrate support and that employs the weight vector values as control values for multiple heating elements according to some embodiments.

DETAILED DESCRIPTION OF EMBODIMENTS

Figure 1:
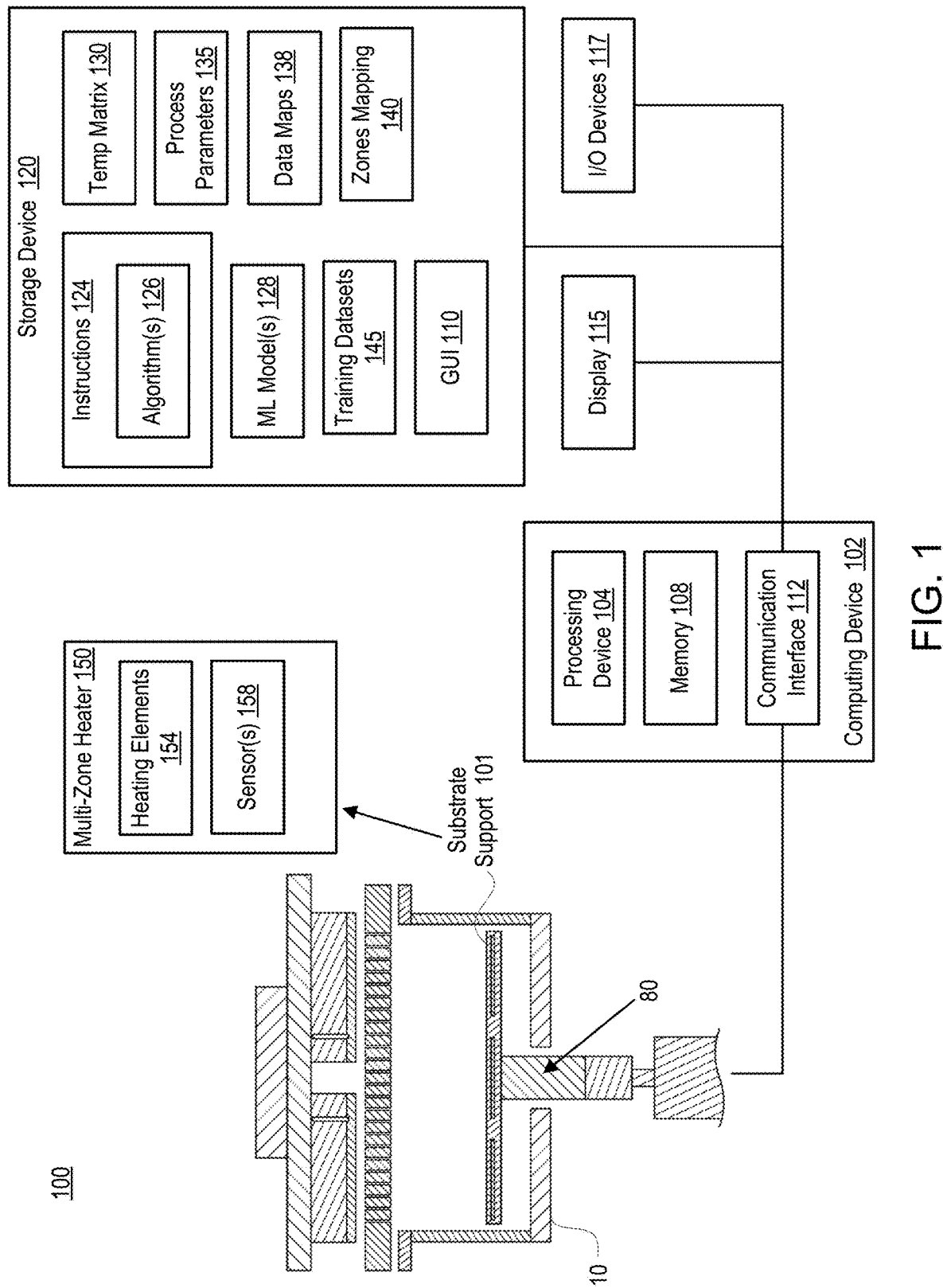
FIG. 1 is a block diagram of a control system that includes a multi-zone heater within a substrate support according to various embodiments.

Embodiments described herein are related to systems and methods for tuning a multi-zone heater that is located in a substrate support of a processing chamber. The multiple zones, such as geographic zones, can be associated with multiple separate heating elements embedded within the substrate support. These geographic zones can be, for example, concentric zones and/or sectored zones as will be discussed in detail. One approach to tuning temperature set points of the multiple heating elements is to iteratively fix some temperature set point(s) while changing other(s) in order to find an optimal combination of setpoints that generally achieves uniformity of the film thickness or other film-related parameter. For this approach, however, it can be difficult to achieve uniformity and is time-consuming to eventually tune the temperature set points of two or three heating elements, let alone four or more heating elements (e.g., those of a 7-zone heater). For example, the level of complexity of the tuning process exponentially grows with the number of heating elements of the multi-zone heater.

To resolve these complexities with a computer-processing-driven approach that significantly reduces time required for tuning and significantly increases uniformity, the disclosed systems and methods employ one or both of a temperature matrix or a machine leaning model that generates temperature set points for control of the multiple heating elements of the multi-zone heater. In one embodiment, the temperature matrix includes multiple vectors corresponding to the multiple zones, where values in each vector represent a temperature rise across locations on the substrate support as a result of a corresponding heating element, of the multiple heating elements, being activated at a temperature set point. Thus, a combination of the vectors of this matrix enables the superposition of these temperature rises in a way that enables causing a more uniform temperature across the substrate support. A weight vector made up of estimated weight values can be multiplied by the multiple vectors to generate a temperature map. A target thickness map can be based on the difference between an original thickness map generated at a uniform temperature and the temperature map. The estimated weight values can be iteratively updated so that the temperature map results in a minimization to a standard deviation of thickness values (or other film parameter values) within a target thickness map. The estimated weight values that result after the standard deviation falls below a threshold value can be used as (or in calculation of) control values for the heating elements of the multi-zone heater in processing subsequent substrates.

In another embodiment, a computing device can train a machine learning model to generate the values of the temperature matrix (and optionally also of the weight vector) using a training dataset of a number of data items. Each data item can include a set of temperature values across locations of the substrate support and a set of thickness values of a film on a substrate that is processed while positioned on the substrate support. A computing device can input the training dataset into the machine learning model and train the machine learning model based on the training dataset to generate a trained machine learning model that updates values of the temperature matrix. The temperature matrix can then be employed in the process just described.

In still another embodiment, the computing device can train a machine learning model using a training dataset of data items from previous substrate processing runs. For example, each data item can include a group of temperature set points and a thickness map associated with a substrate. The group of temperature set points control the multiple heating elements and the thickness map includes data characterizing a film thickness across locations of a film on the substrate. The computing device can then input the training dataset into the machine learning model and train the machine learning model based on the training dataset to generate a trained machine learning model that is to receive, as an input, a target thickness and is to output a set of temperature set points for the multiple heating elements that results in the film having the target thickness.

Therefore, advantages of the systems and methods implemented in accordance with some embodiments of the present disclosure include, but are not limited to, the ability to effectively tune the multiple heating elements of a multi-zone heater, e.g., determine a temperature set point for each heating element, within a reasonable period of time and to a stringent standard of uniformity of the film thickness and/or some other film-related parameter. The disclosed approach can tune temperature maps (which affect the uniformity of the film thickness and/or film-related parameter) in a manner not possible without multi-zone tuning knobs associated with the multiple heating elements. For example, heat can be focused into one or more zones while keeping the other zones relatively unheated, thus providing a high level of granularity of temperature modification across geographic regions of the substrate. Other advantages will be discussed and still others will be apparent to those skilled in the art having the benefit of this disclosure.

FIG. 1 is a block diagram of a control system 100 that includes a multi-zone heater 150 within a substrate support 101 according to various embodiments. The control system 100 includes a pedestal 80 within a processing chamber 10 that is attached to the substrate support 101. The processing chamber 10 is adapted to perform a process on a substrate positioned on the substrate support 101. The processing chamber 10 can be an etch chamber, a deposition chamber (e.g., an atomic layer deposition chamber, a chemical vapor deposition chamber, a physical vapor deposition chamber, and so on), or other type of process chamber. The processing chamber 10 can be configured to perform one or more plasma-based processes, such as a plasma etch process or a plasma-enhanced deposition process. In various embodiments, the process can involve a film that covers the substrate, to include, for example, deposition, etch, growth, and anodization processes, where a thickness of the film layer varies with temperature. For example, a film can be thicker at lower temperatures and thinner at higher temperatures. Thus, to create a more uniform thickness in the film, the computing device 102 can adjust the temperature across the substrate support 101 to be more uniform by varying the temperature set points of multiple heating elements 154 of the multi-zone heater 150. The temperature set points (or control values for the temperature set points) can be temperature values and/or power output values or the like.

In these embodiments, the control system 100 further includes a computing device 102, a display device 115, input/output (I/O) device 117, and a storage device 120. The computing device 102 can be a computing or computer system. In some embodiments, the computing device 102 includes a processing device 104, a memory 108, and one or more communication interface 112 adapted to interface with the multi-zone heater 150, e.g., via the pedestal 80, the display device 115, the I/O devices 117, and/or the storage device 120. In these embodiments, the storage device 120 stores instructions 124 to include algorithm(s) 126 and other computer code, machine learning (ML) model(s) 128, a temperature matrix 130, process parameters 135, data maps 138, zones mapping data 140, a graphical user interface (GUI) 110, and/or training datasets 145. The instructions 124 can also be associated with and trained for execution of a trained ML model of the ML models 128. Other data can be stored in the storage device 120, as will be discussed in more detail.

In various embodiments, the multi-zone heater 150 includes, but is not limited to, the multiple heating elements 154, each having its own temperature set point that controls a temperature level of that heating element, and one or more sensors 158. Each heating element 154 is associated with a zone of multiple geographic zones of the substrate support 101 (e.g., see FIG. 1B), yet causes a temperature rise of not just that zone, but also of other locations in other geographic zones on the substrate support 101. The temperature rise caused by the zone decreases as the locations get farther away from the zone whose heating element is activated. Thus, the temperature at any given location on the substrate support 101 is a combination of temperature contributions from all activated heating elements 154.

In some embodiments, the one or more sensors 158 can be a thickness imaging sensor capable of imaging a film located on a substrate positioned on the substrate support 101. The thickness imaging sensor can detect a thickness across one or more locations of the substrate, and provide these thickness values to the computing device 102. In another embodiment, metrology equipment outside of the processing chamber 10 is used following processing to determine the thickness of the film. As will be discussed, these thickness values (e.g., thickness maps) can be used in determining a target temperature map or set of target temperature values across the substrate support 101 for subsequent process runs that will minimize the standard deviation of the thickness (or other film-related process parameter) values.

In various embodiments, the processing device 104 is a processor, such as a central processing unit (CPU) and/or a graphics processing unit (GPU), and/or other processing device that includes a processor. The processing device 104 can include one or more general processors, digital signal processors, application specific integrated circuits, field programmable gate arrays, digital circuits, optical circuits, analog circuits, combinations thereof, or other now known or later-developed devices for analyzing and processing data. The processing device 104 can implement the instructions 124 or other software program, such as manually-programmed or computer-generated code for implementing logical functions. The logical function or system element described can, among other functions, process and/or convert an analog data source such as an analog electrical, audio, or video signal, or a combination thereof, to a digital data source for audio-visual purposes or other digital processing purposes such as for compatibility for computer processing.

The storage device 120 can include a non-transitory computer-readable medium in which one or more sets of instructions 124, e.g., software, can be embedded. In one embodiment, the storage device 120 is a disk or optical drive unit. Further, the instructions 124 can perform one or more of the operations as described herein. The instructions 124 can reside completely, or at least partially, within the memory 108 and/or within the processing device 104 during execution by the computing device 102.

The memory 108 and the processing device 104 can also include non-transitory computer-readable media as discussed above. A "computer-readable medium," "computer-readable storage medium," "machine readable medium," "propagated-signal medium," and/or "signal-bearing medium" can include any device that includes, stores, communicates, propagates, or transports software for use by or in connection with an instruction executable system, apparatus, or device. The machine-readable medium can selectively be, but not limited to, an electronic, magnetic, optical, electromagnetic, infrared, or semiconductor system, apparatus, device, or propagation medium.

The I/O devices 117 can include peripheral devices, such as a keyboard or mouse, configured for a user to interact with any of the components of control system 100. Further, the display device 115 can be a liquid crystal display (LCD), a cathode ray tube (CRT), or other display suitable for conveying information through a touch screen or computer screen. The display device 115 can act as an interface for the user to see the functioning of the processing device 104, or specifically as an interface with the software stored in the memory 108 or the storage device 120.

In some embodiments, the GUI 110 can be illustrated on the display device 115 to provide an interface to users via the I/O devices 117. The GUI 110 can facilitate submitting a metrology file, including temperature and processing parameter constraints. The metrology file can include, for example, an original thickness map generated (e.g., by the thickness imaging sensor) when the film was exposed to a uniform temperature. For example, the user can chose within the GUI 110 a value for a film-related property k, a temperature sensitivity value of a particular percent thickness variation per ° C., a baseline temperature, and the like. The GUI 110 can also provide a "type" is a dropdown menu that is selectable to choose the type of multi-zone heater, some of which are discussed by way of example with reference to FIGS. 2A-2D.

In various embodiments, the algorithms 126 can include formulas or other sets of mathematical operations that can operate on the data stored in association with tuning the multi-zone heater 150. For example, one of the algorithms can correlate the multiple zones (see FIG. 1B) of the substrate support 101 with the multiple heating elements 154 configured to heat the substrate during processing, to generate the zones mapping data 140. The zones mapping data 140 can be used in correlation with finding temperature set points for the multiple heating elements 154 and to determine how a combination of the temperature set points impact the data maps 138 and/or training datasets 145 corresponding to the various zones.

Others of the algorithms 126 can update and/or operate on the temperature matrix 130, along with a corresponding weight vector, to determine at least some of the data maps 138. The data maps 138 can be used in turn to iteratively update estimated weight values of the weight vector(s), as will be discussed in more detail with reference to FIGS. 3A-8A. The data maps 138, for example, can include a temperature map of temperature values across locations of the substrate support 101. The data maps 138 can further include a thickness map of thickness values of a film across locations of a substrate that is positioned on the substrate support 101. The data maps 138 can further include a parameter map of film-related parameter values across locations of a substrate that is positioned on the substrate support 101. In one embodiment, the parameter map is of k, which represents the extinction coefficient of the film on the substrate. Other film-related processing parameters are also envisioned.

In another embodiment, the computing device 102 can train the ML model 128 to generate the values of the temperature matrix 130 (and optionally also of the weight vector) using a training dataset (e.g., of the training dataset 145) that includes a number of data items. Each data item can include a set of temperature values across locations of the substrate support 101 and a set of thickness values of a film on a substrate that is processed while positioned on the substrate support 101. The computing device 102 can input the training dataset into the ML model 128 and train the ML model 128 based on the training dataset to generate a trained ML model that updates values of the temperature matrix 130. The temperature matrix 130 can then be employed in tuning the multi-zone heater 150, as will be discussed with reference to FIGS. 3A-7.

In embodiments, the computing device 102 can train the ML model 128 using a training dataset (e.g., of the training datasets 145) that includes data items from previous substrate processing runs. For example, each data item can include a group of temperature set points and a thickness map associated with a substrate. The group of temperature set points control the multiple heating elements 154 and the thickness map includes data characterizing a film thickness across locations of a film on the substrate. The computing device 102 can then input the training dataset into the ML model 128 and train the ML model 128 based on the training dataset 145 to generate a trained ML model that is to receive, as an input, a target thickness and/or a process to be performed and is to output a set of temperature set points for the multiple heating elements 154 that results in the film having the target thickness for the process.

The machine learning model 128 can be a neural network, a deep learning network, a convolutional neural network, a recurrent neural network, a clustering model, a random forest model, a dimensionality reduction model, a decision tree, a support vector machine, a regression analysis model, a Bayesian network, and/or other type of machine learning model. The machine learning model 128 can be trained using supervised learning, semi-supervised learning, or unsupervised learning.

One type of machine learning model that can be used is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities can be addressed, at lower layers, on top of which a multi-layer perceptron is commonly appended, mapping top layer features extracted by the convolutional layers to decisions (e.g. classification outputs).

Deep learning is a class of machine learning algorithms that use a cascade of multiple layers of nonlinear processing units for feature extraction and transformation. Each successive layer uses the output from the previous layer as input. Deep neural networks can learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs can be that of the network and can be the number of hidden layers plus one. For recurrent neural networks, in which a signal can propagate through a layer more than once, the CAP depth is potentially unlimited.

Training of a neural network can be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

In some embodiments, the machine learning model is trained to generate a temperature matrix, which enables a temperature to be input for a particular zone and an effect on a physical result based on that temperature to be determined across multiple zones. Once the temperature matrix is complete, a full understanding is achievable of predicted physical results (e.g., of layer thickness) across multiple zones of a wafer based on temperature setpoints at one or more zones of the multi-zone heater 150. In some embodiments, the machine learning model is trained to output a set of suggested temperature setpoints to achieve a film with a layer having a target thickness and/or a target uniformity.

FIGS. 2A-2D are top views of various embodiments of a substrate support that may be utilized as the substrate support 101 in the control system 100 of FIG. 1. Each of the substrate supports illustrated in FIGS. 2A-2D include multiple zones that may be individually heated, e.g., using individual heating elements 154. Each of the zones may also be individually monitored for temperature metrics and adjusted, as needed, based on a desired temperature profile. A substrate or wafer (not shown) is to be positioned on the top surface of each substrate support and generally centered on the top surface. Thus, a thickness of and other processing parameter values associate with a film located on the substrate is impacted by varying temperature profiles.

Figure 2A:
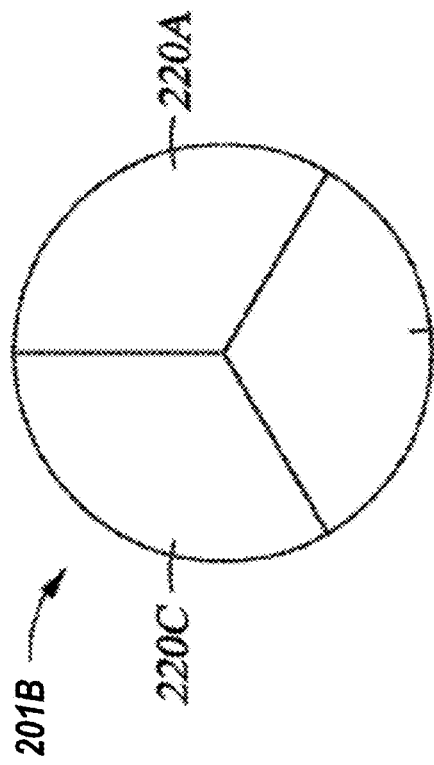
FIGS. 2A-2D are top views of various embodiments of a substrate support that may be utilized as the substrate support in the control system of FIG. 1.

FIG. 2A shows the top surface of a substrate support 201A having three zones, such as an inner zone 205, an intermediate zone 210, and an outer zone 215. In one embodiment, each of the zones 205, 210, and 215 are concentric. As an example, the inner zone 205 may include a radius from 0 to about 85 millimeters (mm) from the center of the substrate support. As another example, the intermediate zone 210 may include an inside radius substantially the same as the radius of the outer perimeter of the inner zone 205 to a radius of about 123 mm. As another example, the outer zone 215 may include an inside radius substantially the same as the radius of the outer perimeter of the intermediate zone 210 to a radius of about 150 mm or greater, such as about 170 mm, for example, about 165 mm.

Figure 2B:
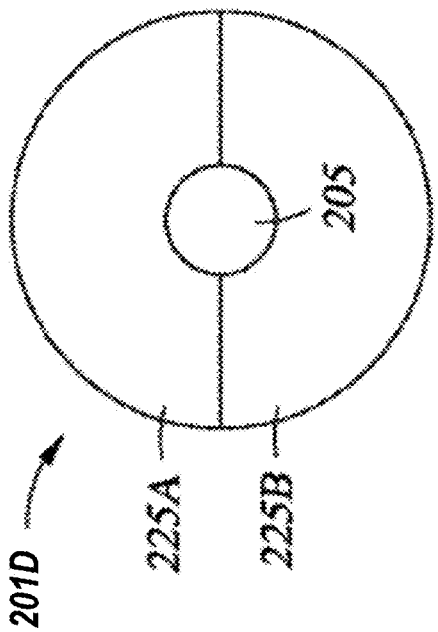

FIG. 2B shows a substrate support 201B wherein multiple zones 220A-220C extend in sections around the substrate support in a pie shape. Each zone 220A, 220B and 220C may be heated similarly or differently depending on desired processing conditions. While the substrate support 201B includes three zones, the number of zones may be greater or less than three.

In some embodiments, one or more of the zones 205, 210, and 215 (or additional concentric zones) are combined with one or more of the zones 220A, 220B, 220C (or additional pie-shaped zones). In these embodiments, the heating elements of each zone can be overlapping and thus contribute to heating different locations of each zone in an additive manner. More specifically, if all of the zones 220A, 220B, 220C are employed with all of the zones 205, 210, and 215, then the heating element of zone 220A, for example, would overlap a top-right section of all of the zones 205, 210, and 215. In this way, contribution of multiple heating elements in different zones can contribute in an overlapping fashion to the temperature at different locations across the surface of a substrate support.

Figure 2C:
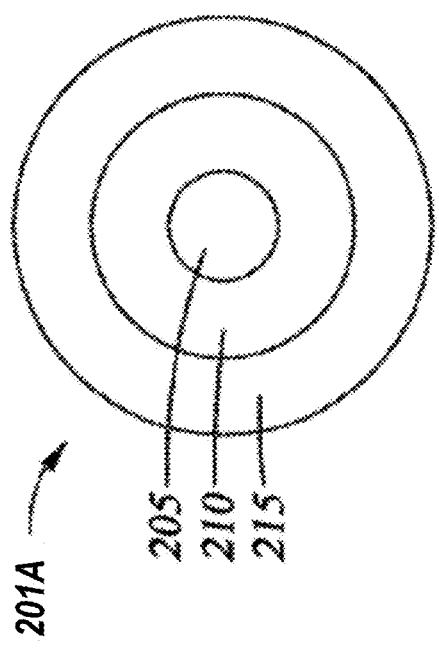

FIG. 2C shows a substrate support 201C wherein multiple zones 220A-220C are provided in a pie shape, similar to the substrate support 201B shown in FIG. 2B. However, the substrate support 201C also includes an inner zone 205 similar to the substrate support 201A shown in FIG. 2A. The inner zone 205 may extend from a center of the substrate support 201C to a radius of about 50 mm or greater, such as between about 80 mm to about 90 mm.

Figure 2D:
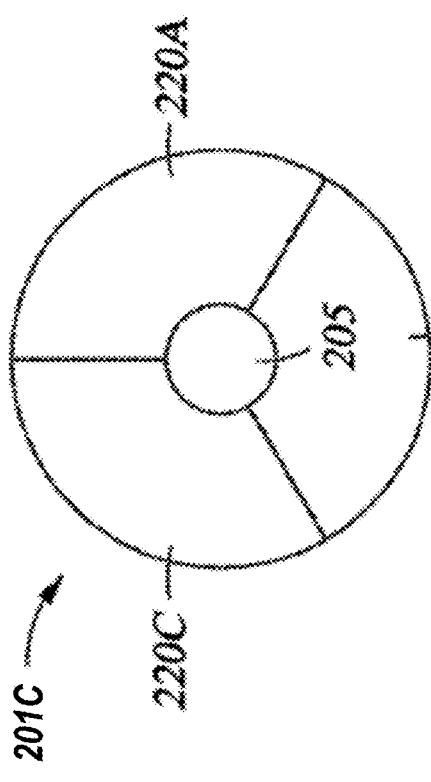

FIG. 2D shows a substrate support 201D wherein multiple outer zones 225A and 225B surround an inner zone 205. In one embodiment, each of the multiple outer zones 225A and 225B are arc-shaped. In some embodiments, each of the multiple outer zones 225A and 225B are shaped substantially as a semicircle. The inner zone 205 may extend from a center of the substrate support 201C to a radius of about 50 mm or greater, such as between about 80 mm to about 90 mm in some embodiments.

Adjustments to the temperature set points of the heating elements associated with the zones illustrated in FIGS. 2A-2D impact the temperature value of each location of multiple locations across the surface of a substrate support, and thus by temperature transfer, to the substrate as well. As discussed, temperature values at locations far away from a zone are less impacted by the heating element(s) of that zone. Conversely, temperature values at locations close to the zone are more directly impacted by the heating element of that zone. These temperature values can make up a temperature map of the data maps 138. A temperature map can be a map representing a wafer divided into multiple zones, where a temperature value can be assigned to each zone.

In some embodiments, the temperature map is not limited to the zones of the multi-zone heater, and can include different temperature values for each point on a wafer. Further, in various embodiments, the computing device 102 is configured to determine a target temperature map for certain films on the substrate via execution of the algorithms 126 and/or ML models 128, as will be discussed in the following Figures. In these embodiments, the target temperature map can be determined such as to minimize the standard deviation of thickness values within a target thickness map. A thickness map can be a map representing a wafer (or substrate), where thickness values are assigned to multiple different regions of the thickness map. The regions of the thickness map can be the same as or different from the zones of the temperature map. In embodiments, the thickness map includes thickness values for every point on a wafer.

Figure 3A:
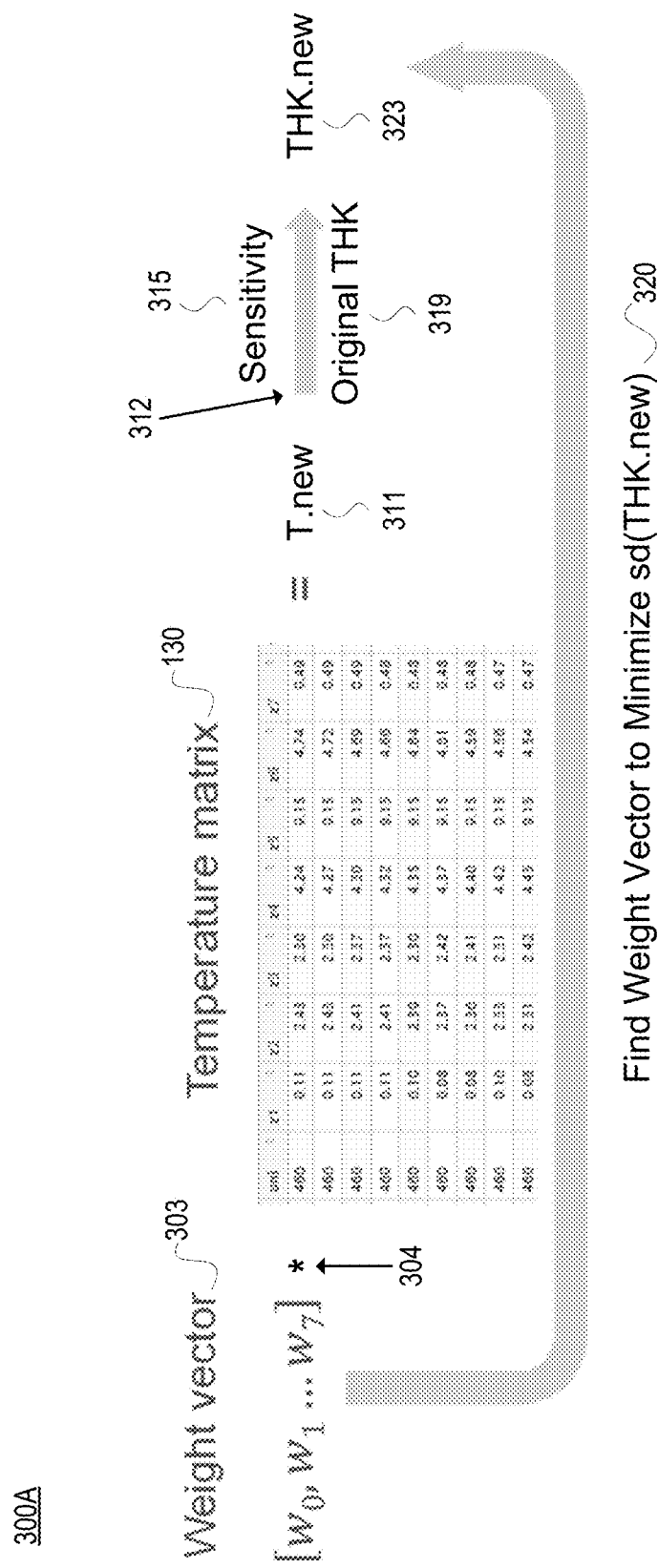
FIG. 3A is a schematic flow diagram of a method for finding a weight vector that minimizes a standard deviation of thickness of a film across the substrate support according to some embodiments.

FIG. 3A is a schematic flow diagram of a method 300A for finding a weight vector 303 that minimizes a standard deviation of thickness of a film across the substrate support 101 according to some embodiments. As discussed, the temperature matrix 130 includes multiple vectors (here, column vectors), each corresponding to one of the multiple zones of the multi-zone heater 150C. While seven zones are illustrated, this is only by way of example, as the zones of the temperature matrix 130 can correspond to two or more zones of the multiple-zone heater 150C.

The first vector of the temperature matrix 130 can hold a base temperature value and each other vector can include values that represent a temperature rise across location on the substrate support as a result of a corresponding heating element being activated at a temperature set point. The values of the multiple vectors are illustrated only by way of example, and can vary widely depending on the film and different processes being employed. As illustrated, some of the values of the temperature matrix 130 are below one and others are significantly higher than one, illustrating the divergent influence on temperature by zone at different locations of the substrate support. For example, in some embodiments, the values in a vector of the multiple vectors of the temperature matrix 130 includes first values for locations within a zone, of the multiple zones, corresponding to the vector and second values for locations not within the zone corresponding to the vector. The first values are larger than the second values, and the second values get smaller farther away from the zone.

In various embodiments, at operation 304, the computing device 102 calculates a temperature map 311 by matrix multiplication of the weight vector 303 times the temperature matrix 130. The weight vector 303, for example, can include estimated weight values that will create a particular linear combination of the multiple vectors. By way of illustration in the below equation, the $a_{mn}$ vectors are the column vectors of the temperature matrix 130, the $x_n$ values are the values of the weight vector 303, and the $b_m$ values are the values of the temperature map 311.

$$x_1 \begin{bmatrix} a_{11} \\ a_{21} \\ \vdots \\ a_{m1} \end{bmatrix} + x_2 \begin{bmatrix} a_{12} \\ a_{22} \\ \vdots \\ a_{m2} \end{bmatrix} + \ldots + x_n \begin{bmatrix} a_{1n} \\ a_{2n} \\ \vdots \\ a_{mn} \end{bmatrix} = \begin{bmatrix} b_1 \\ b_2 \\ \vdots \\ b_m \end{bmatrix}$$

At operation 312, the computing device 102 calculates a target thickness map 323 of a film on a substrate to be processed on the substrate support 101 based on an original thickness map 319 and the temperature map 311. The original thickness map 319 includes data characterizing an original thickness across locations of an original film on an original substrate heated at a uniform temperature. The original thickness map 319 can be determined, for example, by the thickness imaging sensor discussed previously. In another embodiment, metrology equipment outside of the processing chamber 10 is used following processing to determine the thickness of the film.

With more specificity with reference to operation 312, the computing device 102 can access a temperature sensitivity value 315, e.g., in the storage device 120 or the memory 108, and determine an updated temperature map by subtracting the uniform temperature from the temperature map 130. The computing device 102 can then multiply the temperature sensitivity value by the updated temperature map to determine a changed thickness map. The temperature sensitivity values referred to throughout this disclosure can be understood as the amount of thickness change per one degree C. of temperature change. The temperature sensitivity value 315 is usually negative such that an increase in temperature causes a decrease in film thickness. However, depending on the process being characterized, temperature sensitivity value 315 can be positive. The computing device 102 can then determine the target thickness map 323 by adding the changed thickness map to the original thickness map 319.

At operation 320, the computing device 102 can update the estimated weight values of the weight vector 303 so that the temperature map 311 results in minimizing a standard deviation of thickness values within the target thickness map 323. Operation 320 can be iterated at least one or more times (e.g., after subsequent iterations of operations 304 and 312) in some embodiments in order to minimize the standard deviation of the thickness values, for example, below a threshold value. Once getting below that threshold value, the computing device 102 can adjust the temperature set points of the multiple heating elements 154 using the estimated weight values of the weight vector 303 as control values.

Figure 3B:
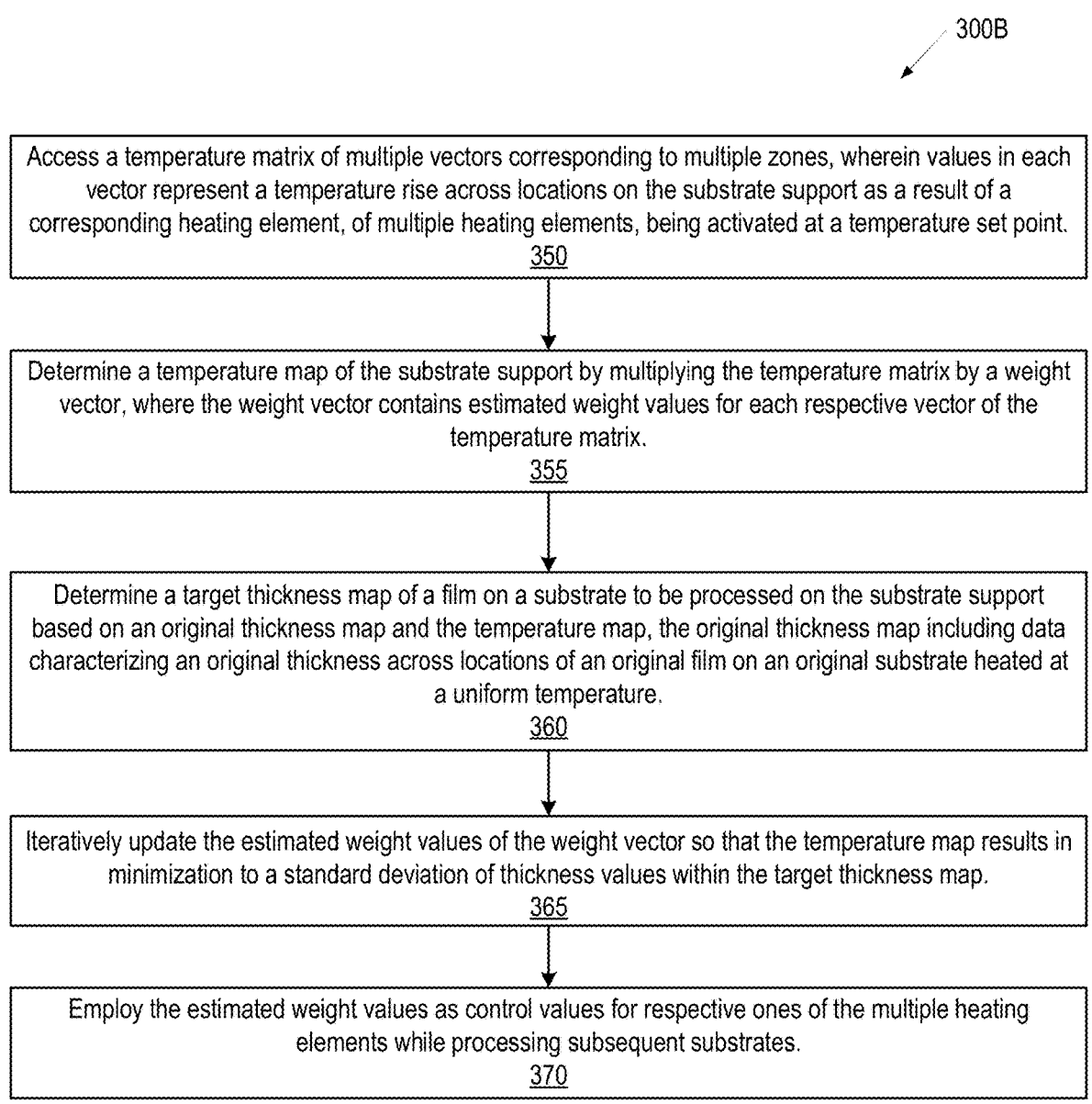
FIG. 3B is a flow diagram of a method for finding a weight vector that minimizes a standard deviation of thickness of a film and employs the weight values as control values for multiple heating elements according to some embodiments.

FIG. 3B is a flow diagram of a method 300B for finding a weight vector that minimizes a standard deviation of thickness of a film and employs the weight values as control values for multiple heating elements according to some embodiments. The method 300B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300B is performed by the computing device 102 (FIG. 1) or other computing system having a processing device. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 350, the processing logic accesses a temperature matrix including multiple vectors corresponding to the multiple zones. Values in each vector represent a temperature rise across locations on the substrate support as a result of a corresponding heating element, of the multiple heating elements, being activated at a temperature set point.

At operation 355, the processing logic determines a temperature map of the substrate support by multiplying the temperature matrix by a weight vector, where the weight vector contains estimated weight values for each respective vector of the temperature matrix.

At operation 360, the processing logic determines a target thickness map of a film on a substrate to be processed on the substrate support based on an original thickness map and the temperature map. The original thickness map includes data characterizing an original thickness across locations of an original film on an original substrate heated at a uniform temperature.

At operation 365, the processing logic iteratively updates the estimated weight values of the weight vector so that the temperature map results in minimization to a standard deviation of thickness values within the target thickness map.

At operation 370, the processing logic employs the estimated weight values as control values for respective ones of the multiple heating elements while processing subsequent substrates.

Figure 4:
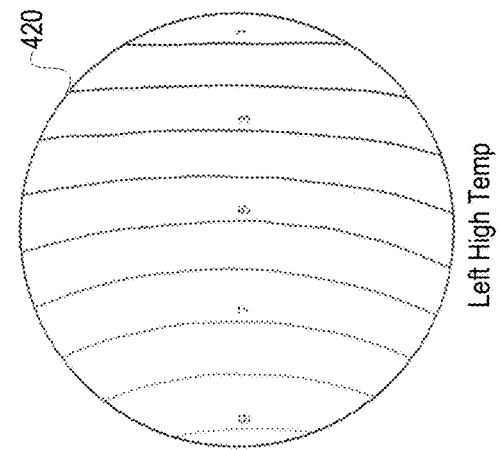
FIG. 4 is a set of images illustrating temperature contours (e.g., maps) of superposition of the seven heating elements according to various embodiments.
Figure 4:
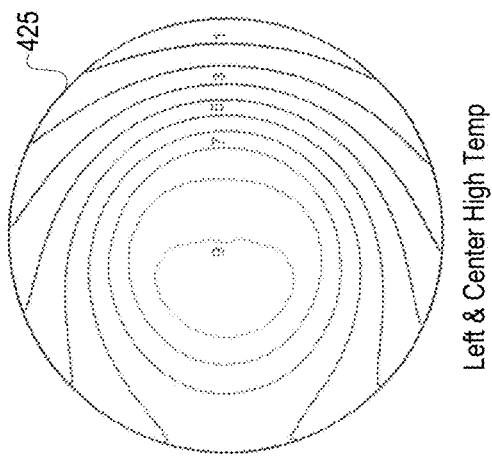
Figure 4:
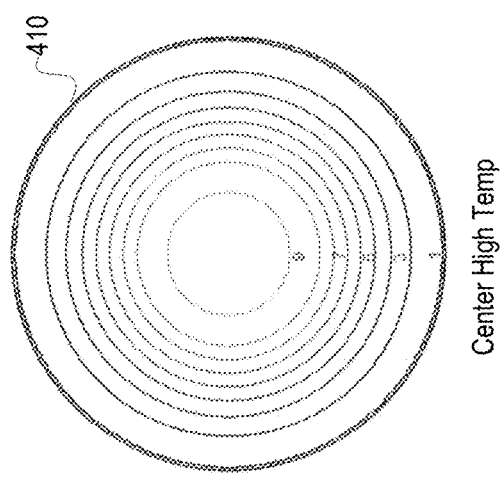
Figure 4:
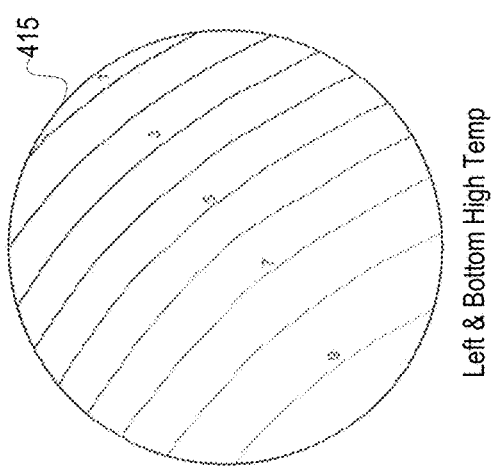

FIG. 4 is a set of images illustrating temperature contours (e.g., maps) of superposition of multiple heating elements according to various embodiments. Some of the temperature maps can be generated via one or more of the zones 205, 210, 215, one or more of the zones 220A, 220B, 220C, or a combination thereof as discussed with reference to FIGS. 2A-2D. Temperature map 410 illustrates multiple concentric zones, where the central concentric zones are selectively set to high temperatures. Temperature map 415 illustrates a combination of concentric and pie-shaped zones in which zones towards left and bottom of the substrate support are selective set to high temperatures. Temperature map 420 illustrates multiple striped zones going from one side to an opposite side of the substrate support, where the left-most zones are selectively set to high temperatures. Temperature map 425 illustrate a combination of concentric and either striped or pie-shaped zones in which the left-most and center zones are selectively set to high temperatures. Many other combinations of zones to generate different unique temperature maps are envisioned in order to optimize film and property thickness, as will be discussed in detail.

Figure 5:
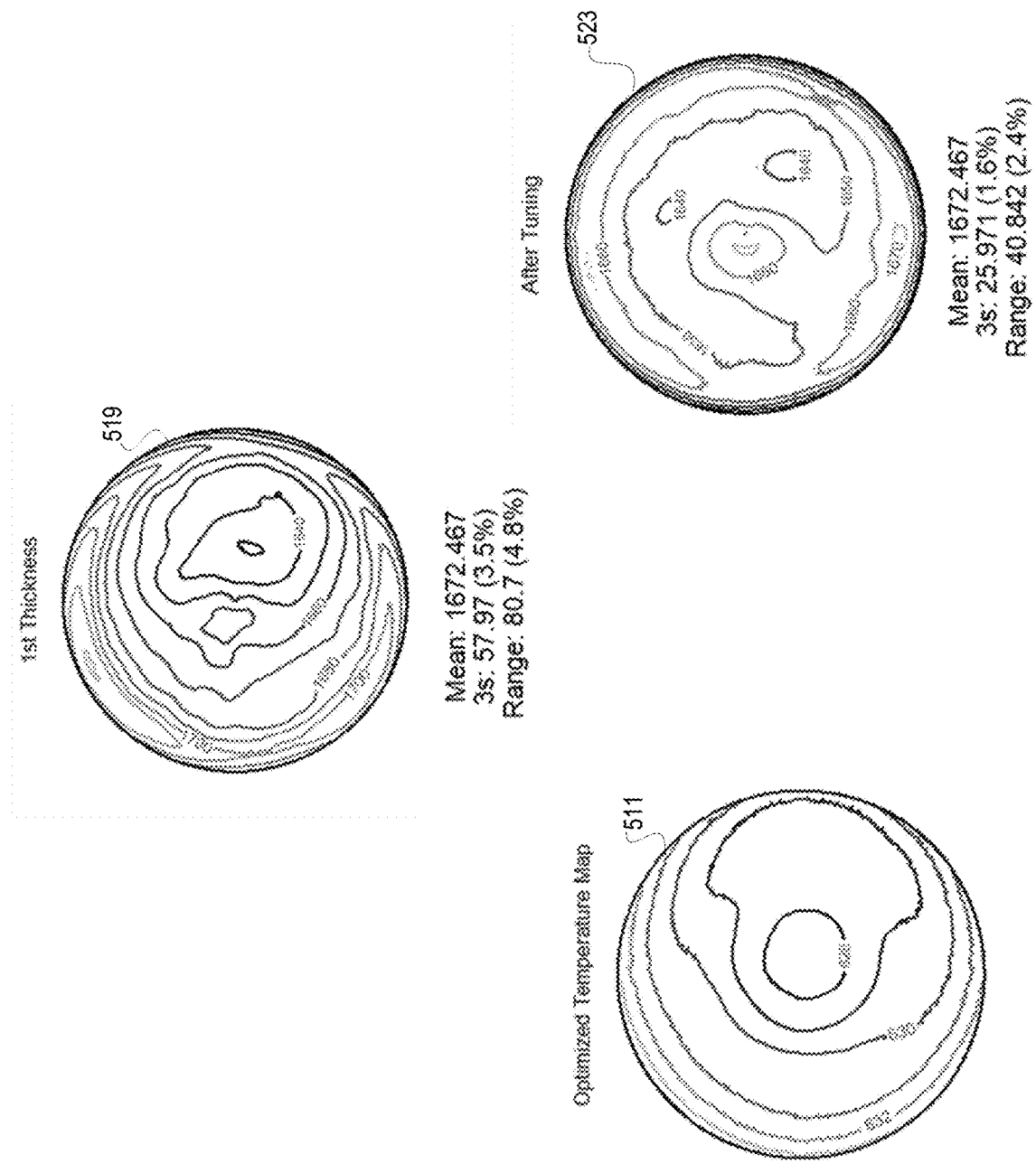
FIG. 5 is a set of images illustrating an original thickness map, an optimized temperature map, and a new thickness map after tuning according to an embodiment.

FIG. 5 is a set of diagrammatic images illustrating an original thickness map 519, an optimized temperature map 511, and a new thickness map 523 after tuning, according to an embodiment. The optimized temperature map 511 can be generated as was discussed with reference to the temperature map 311 of FIG. 3A and operation 355 of FIG. 3B. For example, the optimized temperature map 511 results from choosing estimated weight values of the weight vector so that the temperature map results in minimization to a standard deviation of thickness values within the target thickness map. The new thickness map 523 results after a process is performed on the film on the substrate using the optimized temperature map (e.g., the updated weight vector) to control the temperature set points of the multiple heating elements of the multi-zone heater 150C. The variation in the original thickness map 519 has been improved from 4.8% to 2.4%, which is an approximate 50% improvement in this example.

Figure 6A:
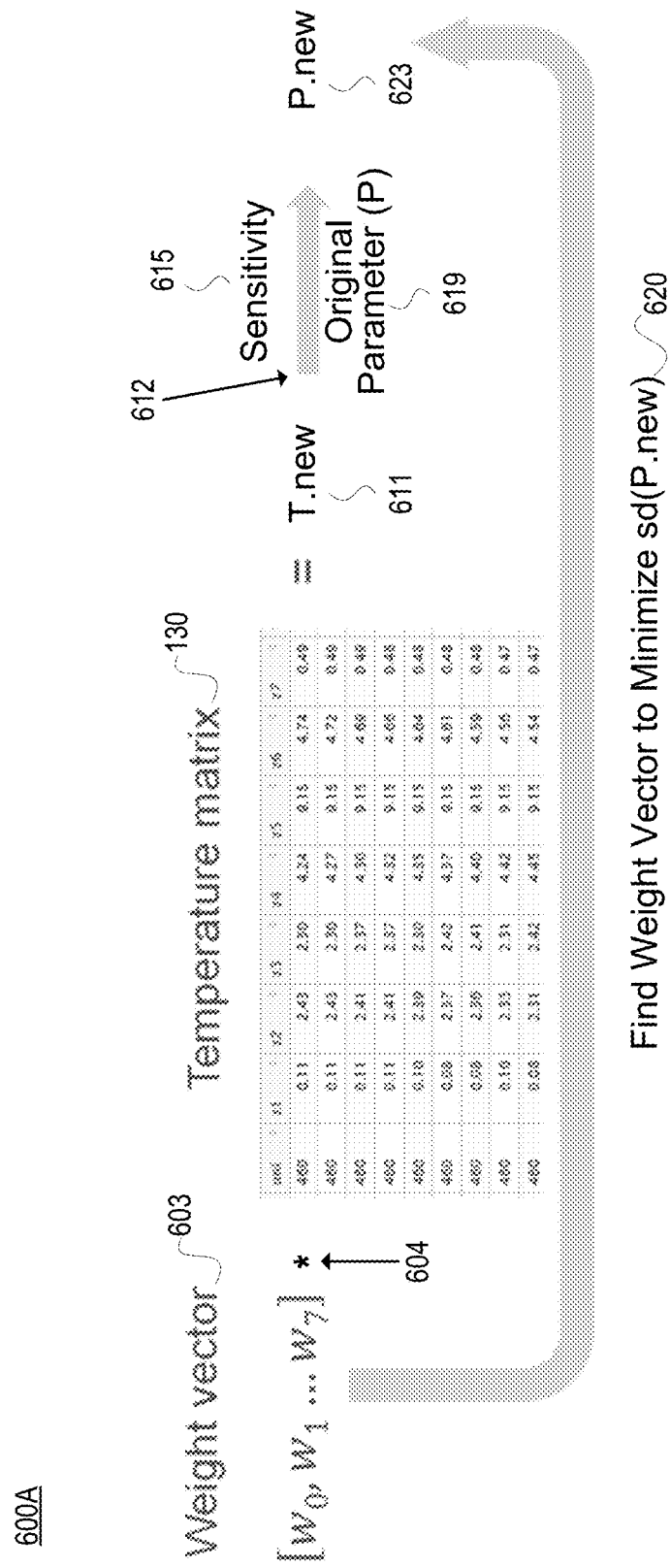
FIG. 6A is schematic flow diagram of a method for finding a weight vector that minimizes a standard deviation of a processing parameter of film across the substrate support according to some embodiments.

FIG. 6A is schematic flow diagram of a method 600A for finding a weight vector that minimizes a standard deviation of a processing parameter of film across the substrate support according to some embodiments. The term "processing" in this context can be understood to refer to deposition, etch, growth, anodization processes, or other process where a thickness of the film layer varies with temperature.

In various embodiments, at operation 604, the computing device 102 calculates a temperature map 611 by matrix multiplication of the weight vector 603 times the temperature matrix 130. The temperature matrix 130 was already discussed with reference to FIG. 1 and FIGS. 3A-3B. The weight vector 603, for example, can include estimated weight values that will create a particular linear combination of the multiple vectors. By way of illustration in the below equation, the $a_{mn}$ vectors are the column vectors of the temperature matrix 130, the $x_n$ values are the values of the weight vector 603, and the $b_m$ values are the values of the temperature map 611.

$$x_1 \begin{bmatrix} a_{11} \\ a_{21} \\ \vdots \\ a_{m1} \end{bmatrix} + x_2 \begin{bmatrix} a_{12} \\ a_{22} \\ \vdots \\ a_{m2} \end{bmatrix} + \ldots + x_n \begin{bmatrix} a_{1n} \\ a_{2n} \\ \vdots \\ a_{mn} \end{bmatrix} = \begin{bmatrix} b_1 \\ b_2 \\ \vdots \\ b_m \end{bmatrix}$$

At operation 612, the computing device 102 calculates a target parameter map 623 of a film on a substrate to be processed on the substrate support 101 based on an original parameter map 619 and the temperature map 611. The original parameter map 619 includes data characterizing values of an original parameter across locations of an original film on an original substrate heated at a uniform temperature. The original parameter map 619 can be determined, for example, by the an imaging sensor or other detection means of the parameter values of the film.

With more specificity with reference to operation 612, the computing device 102 can access a parameter sensitivity value 615, e.g., in the storage device 120 or the memory 108, and determine an updated temperature map by subtracting the uniform temperature from the temperature map 130. The parameter sensitivity values referred to throughout this disclosure can be understood as the amount of parameter value change per one degree C. of temperature change. The parameter sensitivity value 615 is usually positive such that an increase in parameter value (such as for k) causes an increase in film thickness. The computing device 102 can then multiply the parameter sensitivity value by the updated temperature map to determine a changed parameter map. The computing device 102 can then determine the target parameter map 623 by adding the changed parameter map to the original parameter map 619.

At operation 620, the computing device 102 can update the estimated weight values of the weight vector 603 so that the temperature map 611 results in minimizing a standard deviation of parameter values within the target parameter map 623. Operation 620 can be iterated at least one or more times (e.g., after subsequent iterations of operations 604 and 612) in some embodiments in order to minimize the standard deviation of the parameter values, for example, below a threshold value. Once getting below that threshold value, the computing device 102 can adjust the temperature set points of the multiple heating elements 154 using the estimated weight values of the weight vector 603 as control values.

FIG. 6B is a flow diagram of a method 600B for finding a weight vector that minimizes a standard deviation of a processing parameters of a film across the substrate support and that employs the weight vector values as control values for multiple heating elements according to some embodiments. The method 600B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600B is performed by the computing device 102 (FIG. 1) or other computing system having a processing device. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 650, the processing logic correlates each heating element, of multiple heating elements in a multi-zone heater of a substrate support, with a zone of multiple zones of the substrate support configured to heat a substrate during processing.

At operation 655, the processing logic accesses a temperature matrix including multiple vectors corresponding to the multiple zones. The values in each vector represent a temperature rise across locations on the substrate support as a result of a corresponding heating element, of the multiple heating elements, being activated at a temperature set point.

At operation 660, the processing logic determines a temperature map of the substrate support by multiplying the temperature matrix by a weight vector. The weight vector contains estimated weight values for each respective vector of the temperature matrix.

At operation 665, the processing logic determines a target parameter map of a film on a substrate to be processed on the substrate support based on an original parameter map and the temperature map. The original parameter map includes data characterizing a process parameter across locations of an original film on an original substrate heated at a uniform temperature.

At operation 670, the processing logic iteratively updates the estimated weight values of the weight vector so that the temperature map results in minimizing a standard deviation of parameter values within the target parameter map.

At operation 675, the processing logic employs the estimated weight values as control values for respective ones of the multiple heating elements while processing subsequent substrates.

Figure 7:
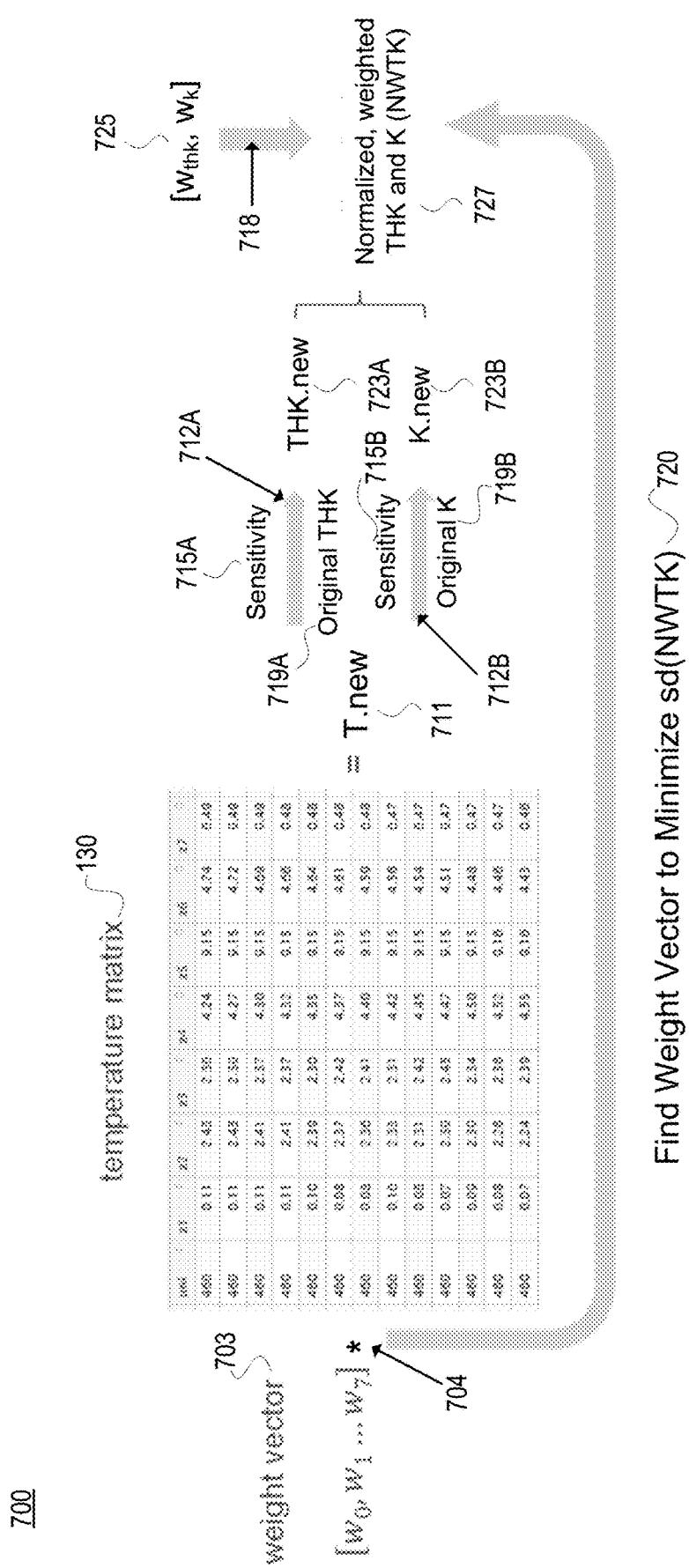
FIG. 7 is a schematic flow diagram of a method for finding a weight vector that minimizes a standard deviation of a normalized, weighted combination of thickness and processing parameter values across the substrate support according to some embodiments.

FIG. 7 is a schematic flow diagram of a method 700 for finding a weight vector that minimizes a standard deviation of a normalized, weighted combination of thickness and processing parameter values across the substrate support according to some embodiments. The method 700 can be viewed as a combination of optimizing for more than one criteria, namely thickness and a processing parameter, the extinction coefficient (k) in this example.

In various embodiments, at operation 704, the computing device 102 calculates a temperature map 711 by matrix multiplication of a weight vector 703 times the temperature matrix 130. The weight vector 703, for example, can include estimated weight values that will create a particular linear combination of the multiple vectors. By way of illustration in the below equation, the $a_{mn}$ vectors are the column vectors of the temperature matrix 130, the $x_n$ values are the values of the weight vector 703, and the $b_m$ values are the values of the temperature map 711.

$$x_1 \begin{bmatrix} a_{11} \\ a_{21} \\ \vdots \\ a_{m1} \end{bmatrix} + x_2 \begin{bmatrix} a_{12} \\ a_{22} \\ \vdots \\ a_{m2} \end{bmatrix} + \ldots + x_n \begin{bmatrix} a_{1n} \\ a_{2n} \\ \vdots \\ a_{mn} \end{bmatrix} = \begin{bmatrix} b_1 \\ b_2 \\ \vdots \\ b_m \end{bmatrix}$$

At operation 712A, the computing device 102 calculates a target thickness map 723A of a film on a substrate to be processed on the substrate support 101 based on an original thickness map 719A and the temperature map 711. The original thickness map 719A includes data characterizing an original thickness across locations of an original film on an original substrate heated at a uniform temperature. The original thickness map 719A can be determined, for example, by the thickness imaging sensor discussed previously.

With more specificity with reference to operation 712A, the computing device 102 can access a temperature sensitivity value 715A, e.g., in the storage device 120 or the memory 108, and determine an updated temperature map by subtracting the uniform temperature from the temperature map 130. The computing device 102 can then multiply the temperature sensitivity value by the updated temperature map to determine a changed thickness map. The computing device 102 can then determine the target thickness map 723A by adding the changed thickness map to the original thickness map 719A.

At operation 712B, the computing device 102 calculates a target parameter map 723B of a film on a substrate to be processed on the substrate support 101 based on an original parameter map 719B and the temperature map 711. The original parameter map 719B includes data characterizing values of an original parameter across locations of an original film on an original substrate heated at a uniform temperature. The original parameter map 719B can be determined, for example, by the an imaging sensor or other detection means of the parameter values of the film.

With more specificity with reference to operation 712B, the computing device 102 can access a parameter sensitivity value 715B and determine an updated temperature map by subtracting the uniform temperature from the temperature map 130. The computing device 102 can then multiply the parameter sensitivity value by the updated temperature map to determine a changed parameter map. The computing device can then determine the target parameter map 723B by adding the changed parameter map to the original parameter map 719B.

At operation 718, the computing device 102 can combine the target thickness map 723A and the target parameter map 723B using a set of weighted values 725 and that normalizes the values that are combined into a target normalized, weighted combination of thickness and processing parameter values 727 across the substrate support 101. The weighted values 725 can weight the thickness values ($w_{thk}$) different from the parameter values ($w_k$), but in a way that adds up to one ("1"). For example, $w_{thk}$ can be 0.7 and $w_k$ can be 0.3 if thickness values are to be given heavier weight than the parameter values. The normalization can be performed in order to combine the terms of thickness and k (the processing parameter) that can be jointly operated on at operation 720.

At operation 720, the computing device 102 can update the estimated weight values of the weight vector 703 so that the target normalized, weighted combination of thickness and processing parameter values 727 results in minimizing a standard deviation of target normalized, weighted combination of thickness and processing parameter values 727. Operation 720 can be iterated at least one or more times (e.g., after subsequent iterations of operations 704, 712A, 712B, and 718) in some embodiments in order to minimize the standard deviation of the target normalized, weighted combination of thickness and processing parameter values 727, for example, below a threshold value. Once getting below that threshold value, the computing device 102 can adjust the temperature set points of the multiple heating elements 154 using the estimated weight values of the weight vector 203 as control values.

Figure 8A:
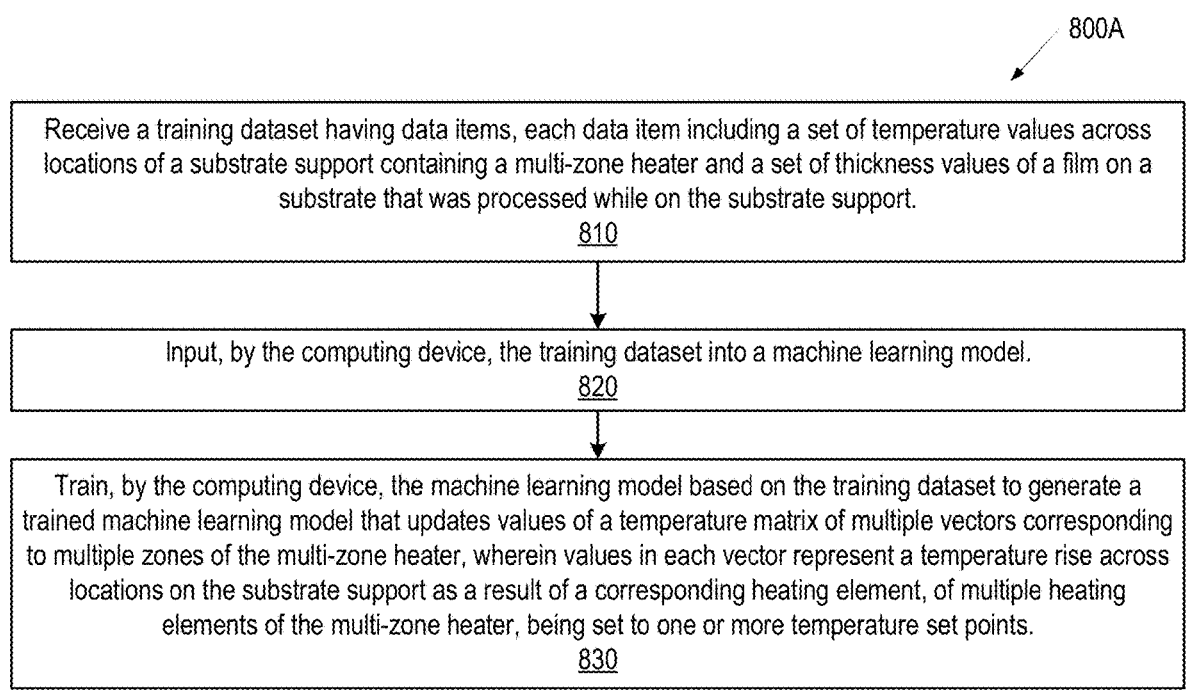
FIG. 8A is a flow chart of a method for training a machine learning model to generate a temperature matrix useable for tuning the multi-zone heater according to various embodiments.

FIG. 8A is a flow chart of a method 800A for training a machine learning model to generate a temperature matrix useable for tuning the multi-zone heater according to various embodiments. The method 800A can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800A is performed by the computing device 102 (FIG. 1) or other computing system having a processing device. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing logic receives a training dataset 145 that includes multiple data items, each data item including a set of temperature values across locations of a substrate support containing a multi-zone heater and a set of thickness values of a film on a substrate that was processed while on the substrate support 101.

At operation 820, the processing logic inputs the training dataset 145 into a machine learning model, e.g., the ML model 128 discussed with reference to FIG. 1. In one embodiment, the machine learning model is an artificial neural network, deep neural network, or other type of trainable artificial intelligence model.

At operation 830, the processing logic trains the machine learning model based on the training dataset to generate a trained machine learning model that updates values of a temperature matrix that includes multiple vectors corresponding to multiple zones of the multi-zone heater. The values in each vector represent a temperature rise across locations on the substrate support as a result of a corresponding heating element, of multiple heating elements of the multi-zone heater, being set to one or more temperature set points. A combination of the multiple vectors includes a target set of temperature values across the substrate support useable to ensure a threshold level of film uniformity. In some embodiments, training the machine learning model further includes determining each set of temperature values useable in a subsequent training iteration by multiplying the weight vector by the temperature matrix, before being updated.

In various embodiments, for a subsequent substrate to be processed, the method 800A can further include determining the target set of temperature values of the substrate support by multiplying the temperature matrix by a weight vector, where the weight vector contains estimated weight values for each respective vector of the temperature matrix. The method 800A can further include determining a target set of thickness values of the film on the subsequent substrate based on an immediate previous set of thickness values of a previously process substrate and the target set of temperature values. The method 800A can further include iteratively updating the estimated weight values of the weight vector so that the target set of temperature values results in minimization to a standard deviation of the target set of thickness values. The method 800A can further include employing the estimated weight values to determine temperature set points for respective ones of the multiple heating elements while processing the subsequent substrate.

In related embodiments, the method 800A can further include accessing a temperature sensitivity value; determining an updated set of temperature values by subtracting the set of temperature values from the target set of temperature values; multiplying the temperature sensitivity value by the updated set of temperature values to determine a set of changed thickness values; and determining the target set of thickness values by adding the set of changed thickness values to the immediate previous set of thickness values.

Figure 8B:
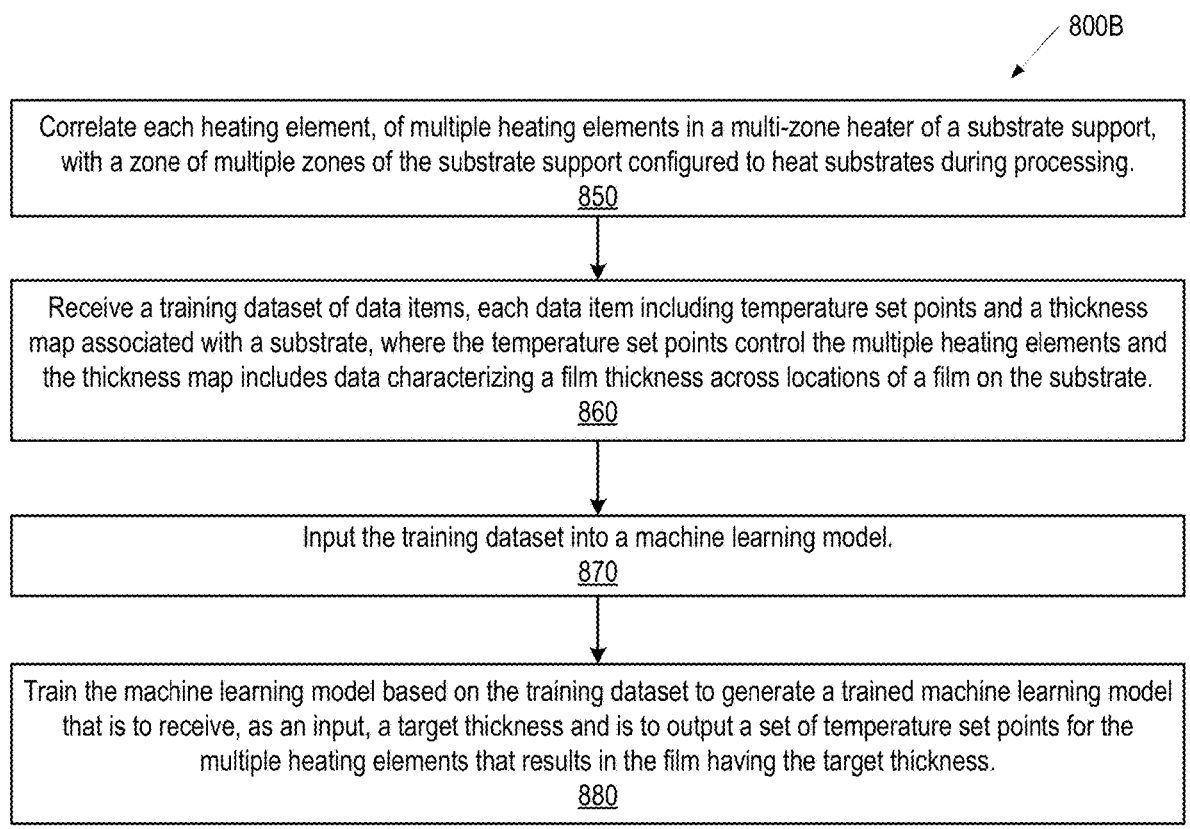
FIG. 8B is a flow chart of a method for training a machine learning model for tuning the multi-zone heater according to various embodiments.

FIG. 8B is a flow chart of a method 800B for training a machine learning model for tuning the multi-zone heater according to various embodiments. The method 800B can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800B is performed by the computing device 102 (FIG. 1) or other computing system having a processing device. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 850, the processing logic correlates each heating element, of multiple heating elements 154 in a multi-zone heater 150 of a substrate support 101, with a zone of multiple zones of the substrate support 101 configured to heat substrates during processing.

At operation 860, the processing logic receives a training dataset 145 including multiple data items for multiple substrates. Each data item of the multiple data items includes temperature set points and a thickness map associated with a substrate. The temperature set points can control the multiple heating elements 154 and the thickness map includes data characterizing a film thickness across locations of a film on the substrate. In some embodiment, the processing logic generates, using a thickness imaging sensor, each thickness map including the thickness values of the film on the substrates 101.

At operation 870, the processing logic inputs the training dataset 145 into a machine learning model, e.g., the ML model 128 previously discussed. In one embodiment, the machine learning model is an artificial neural network, deep neural network, or other type of trainable artificial intelligence model.

At operation 880, the processing logic trains the machine learning model based on the training dataset 145 to generate a trained machine learning model that is to receive, as an input, a target thickness and is to output a set of temperature set points for the multiple heating elements 154 that results in the film having the target thickness. In one embodiment, the target thickness is a substantially uniform thickness that comprises a standard deviation of thickness values across locations of the film that is below a threshold value. In one embodiment, training the machine learning model includes, for each substrate, correlating a combination of temperature values, as a result of the temperature set points, across the locations of the film with thickness values, of the thickness map, across those locations.

Figure 9:
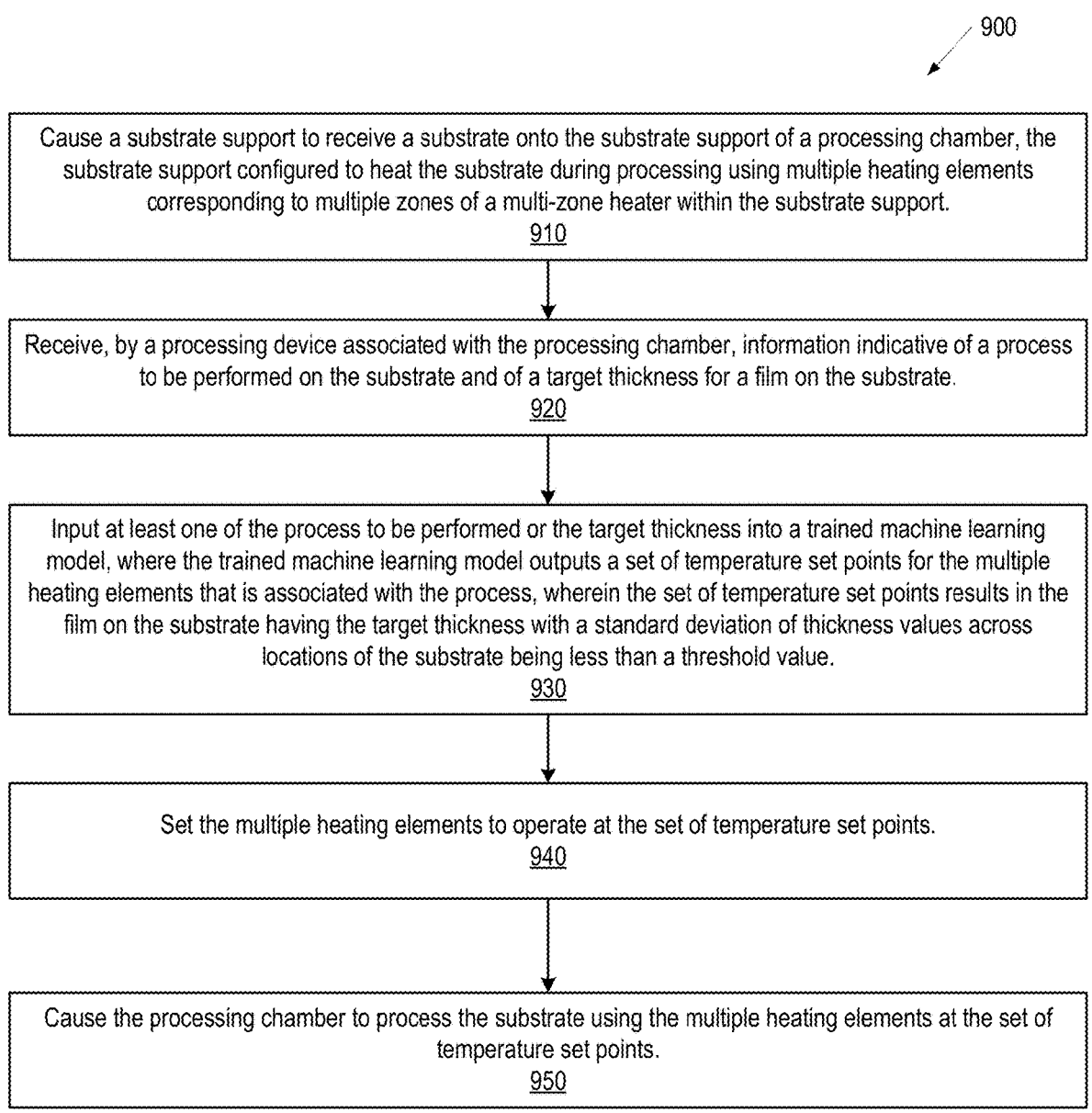
FIG. 9 is a flow chart of a method of using the machine learning model for inferencing input data in order to tune the multi-zone heater according to various embodiments.

FIG. 9 is a flow chart of a method 900 of using the machine learning model for inferencing input data in order to tune the multi-zone heater according to various embodiments. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the computing device 102 (FIG. 1) or other computing system having a processing device. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 910, the processing logic causes the substrate support 101 to receive a substrate onto the substrate support of a processing chamber. The substrate support 101 is configured to heat the substrate during processing using multiple heating elements 154 corresponding to multiple zones of a multi-zone heater 150 within the substrate support 101.

At operation 920, the processing logic is associated with the processing chamber 10 and receives information indicative of a process to be performed on the substrate and of a target thickness for a film on the substrate.

At operation 930, the processing logic inputs at least one of the process to be performed or the target thickness into a trained machine learning model. In some embodiments, the trained machine learning model outputs a set of temperature set points for the multiple heating elements 154 that is associated with the process. In various embodiments, the set of temperature set points results in the film on the substrate having the target thickness with a standard deviation of thickness values across locations of the substrate being less than a threshold value. The trained machine learning model may have been trained for a specific process chamber or for a specific class of process chamber.

At operation 940, the processing logic sets the multiple heating elements 154 to operate at the set of temperature set points.

At operation 950, the processing logic causes the processing chamber to process the substrate using the process with the multiple heating elements 154 set to the temperature set points.

The systems and methods disclosed herein can be realized in hardware, software, or a combination of hardware and software. The method and system can be realized in a centralized fashion in at least one computer system or in a distributed fashion where different elements are spread across several interconnected computer systems. A computer system or other apparatus adapted for carrying out the methods described herein is suited to the present disclosure. A typical combination of hardware and software can be a computer system with a computer program that, when being loaded and executed, controls the computer system such that it carries out the methods described herein. Such a programmed computer can be considered a special-purpose computer.

The method and system can also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
a multi-zone heater comprising multiple heating elements within a substrate support configured to heat a substrate undergoing processing, wherein the multiple heating elements correspond to multiple zones of the substrate support; and
a processing device coupled to the multiple heating elements, the processing device to:
access a temperature matrix comprising multiple vectors corresponding to the multiple zones, wherein values in each vector represent a temperature rise across locations on the substrate support as a result of a corresponding heating element, of the multiple heating elements, being activated at a temperature set point;
determine a temperature map of the substrate support by multiplying the temperature matrix by a weight vector, wherein the weight vector contains estimated weight values for each respective vector of the temperature matrix;
determine a target thickness map of a film on a substrate to be processed on the substrate support based on an original thickness map and the temperature map, the original thickness map comprising data characterizing an original thickness across locations of an original film on an original substrate heated at a uniform temperature;
iteratively update the estimated weight values of the weight vector so that the temperature map results in minimization to a standard deviation of thickness values within the target thickness map; and
save the estimated weight values as control values for respective ones of the multiple heating elements;
wherein the multi-zone heater is configured to retrieve and employ the estimated weight values in processing subsequent substrates to ensure a threshold level of film uniformity on the subsequent substrates.

2. The system of claim 1, wherein the minimization to the standard deviation is performed by ensuring the standard deviation of the thickness values are below a threshold value.

3. The system of claim 1, wherein values in a vector, of the multiple vectors, comprise:
first values for locations within a zone, of the multiple zones, corresponding to the vector; and
second values for locations not within the zone corresponding to the vector, wherein the first values are larger than the second values, and the second values get smaller farther away from the zone.

4. The system of claim 1, wherein the processing device is further to:
access a temperature sensitivity value;
determine an updated temperature map by subtracting the uniform temperature from the temperature map;
multiply the temperature sensitivity value by the updated temperature map to determine a changed thickness map; and
determine the target thickness map by adding the changed thickness map to the original thickness map.

5. A method comprising:
correlating each heating element, of multiple heating elements in a multi-zone heater of a substrate support, with a zone of multiple zones of the substrate support configured to heat a substrate during processing;
accessing, by a processing device, a temperature matrix comprising multiple vectors corresponding to the multiple zones, wherein values in each vector represent a temperature rise across locations on the substrate support as a result of a corresponding heating element, of the multiple heating elements, being activated at a temperature set point;
determining, by the processing device, a temperature map of the substrate support by multiplying the temperature matrix by a weight vector, wherein the weight vector contains estimated weight values for each respective vector of the temperature matrix;
determining, by the processing device, a target parameter map of a film on a substrate to be processed on the substrate support based on an original parameter map and the temperature map, the original parameter map comprising data characterizing a process parameter across locations of an original film on an original substrate heated at a uniform temperature;
iteratively updating, by the processing device, the estimated weight values of the weight vector so that the temperature map results in minimizing a standard deviation of parameter values within the target parameter map; and
saving, by the processing device, the estimated weight values as control values for respective ones of the multiple heating elements; and
retrieving and employing, by the multi-zone heater in processing subsequent substrates, the estimated weight values to ensure a threshold level of film uniformity on the subsequent substrates.

6. The method of claim 5, wherein minimizing the standard deviation is performed by ensuring the standard deviation of the parameter values is below a threshold value.

7. The method of claim 5, wherein the process parameter is an extinction coefficient (k) of the film.

8. The method of claim 5, wherein values in a vector, of the multiple vectors, comprise:
first values for locations within a zone, of the multiple zones, corresponding to the vector; and
second values for locations not within the zone corresponding to the vector, wherein the first values are larger than the second values, and the second values get smaller farther away from the zone.

9. The method of claim 5, further comprising:
accessing a parameter sensitivity value;

determining an updated temperature map by subtracting the uniform temperature from the temperature map;
multiplying the parameter sensitivity value by the updated temperature map to determine a changed parameter map; and
determining the target parameter map by adding the changed parameter map to the original parameter map.

10. A method comprising:
receiving, by a computing device, a training dataset comprising a plurality of data items, each data item of the plurality of data items comprising a set of temperature values across locations of a substrate support containing a multi-zone heater and a set of thickness values of a film on a substrate that was processed while on the substrate support;
inputting, by the computing device, the training dataset into a machine learning model; and
training, by the computing device, the machine learning model based on the training dataset to generate a trained machine learning model that updates values of a temperature matrix comprising multiple vectors corresponding to multiple zones of the multi-zone heater, wherein values in each vector represent a temperature rise across locations on the substrate support as a result of a corresponding heating element, of multiple heating elements of the multi-zone heater, being set to one or more temperature set points;
combining the multiple vectors to generate a target set of temperature values across the substrate support; and
employing, by the multi-zone heater, the target set of temperature values in processing subsequent substrates to ensure a threshold level of film uniformity on the subsequent substrates.

11. The method of claim 10, wherein the machine learning model is an artificial neural network.

12. The method of claim 10, further comprising generating, using a thickness imaging sensor, the set of thickness values of the film on the substrate.

13. The method of claim 10, wherein training the machine learning model further comprises determining each set of temperature values useable in a subsequent training iteration by multiplying a weight vector by the temperature matrix, before being updated, wherein the weight vector contains estimated weight values for each respective vector of the temperature matrix.

14. The method of claim 10, further comprising, for a subsequent substrate to be processed:
determining the target set of temperature values of the substrate support by multiplying the temperature matrix by a weight vector, wherein the weight vector contains estimated weight values for each respective vector of the temperature matrix; and
determining a target set of thickness values of the film on the subsequent substrate based on an immediate previous set of thickness values of a previously process substrate and the target set of temperature values.

15. The method of claim 14, further comprising:
iteratively updating the estimated weight values of the weight vector so that the target set of temperature values results in minimization to a standard deviation of the target set of thickness values; and
employing the estimated weight values to determine temperature set points for respective ones of the multiple heating elements while processing the subsequent substrate.

16. The method of claim 14, further comprising:
accessing a temperature sensitivity value;
determining an updated set of temperature values by subtracting the set of temperature values from the target set of temperature values;
multiplying the temperature sensitivity value by the updated set of temperature values to determine a set of changed thickness values; and
determining the target set of thickness values by adding the set of changed thickness values to the immediate previous set of thickness values.

17. A method comprising:
correlating each heating element, of multiple heating elements in a multi-zone heater of a substrate support, with a zone of multiple zones of the substrate support configured to heat substrates during processing;
receiving a training dataset comprising a plurality of data items, each data item of the plurality of data items comprising a plurality of temperature set points and a thickness map associated with a substrate, wherein the plurality of temperature set points control the multiple heating elements and the thickness map comprises data characterizing a film thickness across locations of a film on the substrate;
inputting, by a processing device, the training dataset into a machine learning model;
training, by the processing device, the machine learning model based on the training dataset to generate a trained machine learning model that is to receive, as an input, a target thickness and is to output a set of temperature set points for the multiple heating elements that results in the film having the target thickness; and
employing, by the multi-zone heater, the trained machine learning model in processing subsequent substrates to ensure a threshold level of film uniformity on the subsequent substrates.

18. The method of claim 17, wherein the machine learning model is an artificial neural network.

19. The method of claim 17, wherein the target thickness is a substantially uniform thickness that comprises a standard deviation of thickness values across locations of the film that is below a threshold value.

20. The method of claim 17, further comprising generating, using a thickness imaging sensor, each thickness map including the thickness values of the film on the substrates.

21. The method of claim 17, wherein training the machine learning model comprises, for each substrate, correlating a combination of temperature values, as a result of the plurality of temperature set points, across the locations of the film with thickness values, of the thickness map, across those locations.

22. A method comprising:
receiving a substrate onto a substrate support of a processing chamber, the substrate support configured to heat the substrate during processing using multiple heating elements corresponding to multiple zones of a multi-zone heater within the substrate support;
receiving, by a processing device of the processing chamber, information indicative of a process to be performed on the substrate and of a target thickness for a film on the substrate;
inputting at least one of the process to be performed or the target thickness into a trained machine learning model, wherein the trained machine learning model outputs a set of temperature set points for the multiple heating elements that is associated with the process, wherein the set of temperature set points results in the film on the substrate having the target thickness with a standard deviation of thickness values across locations of the substrate being less than a threshold value;

setting, by the processing device, the multiple heating elements to operate at the set of temperature set points; and processing the substrate in the processing chamber using the multiple heating elements at the set of temperature set points to ensure a threshold level of film uniformity on the substrate.

* * * * *